United States Patent
Grout

[15] 3,699,467
[45] Oct. 17, 1972

[54] BIAS CIRCUIT FOR A COMPLEMENTARY TRANSISTOR OUTPUT STAGE

[72] Inventor: Stephen Grout, Phoenix, Ariz.

[73] Assignee: General Electric Company

[22] Filed: Dec. 29, 1969

[21] Appl. No.: 888,322

[52] U.S. Cl. ....................................330/17, 330/22
[51] Int. Cl. ..............................................H03f 3/18
[58] Field of Search ...........330/13, 17, 18, 22, 40, 23

[56] References Cited

UNITED STATES PATENTS

| | | | |
|---|---|---|---|
| 2,823,312 | 2/1958 | Keonjian | 330/23 X |
| 3,117,253 | 1/1964 | Antoszewski | 330/23 X |
| 3,550,024 | 12/1970 | Hongu et al. | 330/17 X |
| 3,437,945 | 4/1969 | Duncan | 330/17 X |
| 3,529,252 | 9/1970 | Long | 330/17 X |

*Primary Examiner*—Roy Lake
*Assistant Examiner*—Lawrence J. Dah
*Attorney*—W. Joseph Shanley, Stanley G. Corwin, Frank L. Neuhauser, Oscar B. Waddell and Joseph B. Forman

[57] ABSTRACT

A bias circuit for a complementary transistor power amplifier output stage which comprises a biasing transistor having its emitter connected to the base of one of the complementary transistors and its collector connected to the base of the other of the complementary transistors. A collector resistor is in circuit with the collector of the biasing transistor and with a source of biasing potential. The input signal to the amplifier is coupled to the emitter of the biasing transistor and to the base of one of the complementary transistors. In one embodiment, a resistive divider biases the base of the biasing transistor, while in another embodiment, the base of the biasing transistor is directly connected to the source of biasing potential.

6 Claims, 4 Drawing Figures

PATENTED OCT 17 1972 3,699,467

INVENTOR
J. STEPHEN GROUT

BY Thomas A. Briody
ATTORNEYS

BIAS CIRCUIT FOR A COMPLEMENTARY TRANSISTOR OUTPUT STAGE

BACKGROUND OF THE INVENTION

This invention relates to a biasing circuit for a complementary transistor power amplifier output stage. More particularly, this invention relates to a biasing circuit having a biasing transistor in circuit with the complementary transistors and having a collector resistor the size of which determines the collector-to-emitter voltage for the biasing transistor so that the complementary transistors may be properly biased over a wide temperature range.

In order to eliminate transformer networks in transistorized amplifier circuits for size, weight, and thermal dissipation advantages, the prior art has produced a number of circuits which use transistor pairs of opposite conductivity. In particular, complementary transistor output amplifiers have been employed to provide a single ended power output amplifier for driving relatively low impedance load devices. In general, complementary symmetry amplifiers comprise a pair of transistors connected in series wherein one transistor is of one type of conductivity, for example, NPN, and the other transistor is of the opposite conductivity for example, PNP.

It has been a difficulty in the art to bias the pair of transistors for a number of reasons. For example, the pair of transistors are not generally symmetrical to one another, the base-to-emitter voltages for the two different types of conductivity are different and, even more significantly, the base-to-emitter voltage of a transistor varies inversely with the change in temperature. Thus, it is a particularly acute problem to provide a bias circuit which compensates for the changes in the base-to-emitter voltage of the transistors in a complementary pair output stage. Failure to compensate for such changes may cause the operating point of the output transistors to shift, thus causing high dissipation at high temperatures resulting in inefficiency for the circuit, and cross-over distortion at low temperatures.

Moreover, in order to cause the complementary pair of transistors to operate properly in a Class B mode, it is necessary to forward bias the base-emitter junction of both transistors. One conventional way of achieving such biasing is by the use of a properly poled direct current source connected between the respective bases of the complementary transistors. Such an arrangement is shown in the patent to Shockley, U.S. Pat. No. 2,666,818. However, it is generally desired in the art to avoid the need for additional battery biasing sources because of cost and size considerations.

A number of prior art circuits have used various combinations of biasing resistors to bias the base-to-emitter voltages to the complementary transistors, but such arrangements have proved generally unsatisfactory because they make no provision for thermal compensation.

Accordingly, it is an object of this invention to provide a biasing circuit for a complementary pair of transistors in a power amplifier transistor output stage which properly biases the stage while including provisions for temperature compensation.

It is a further object of this invention to provide a biasing transistor for a complementary pair of transistors in a transistorized amplifier stage.

It is another object of this invention to provide a transistorized biasing stage wherein the collector resistor of the biasing transistor may be sized to provide compensation for thermal drift in the base-to-emitter voltages in the output stage.

It is still a further object of this invention to provide a biasing transistor stage in which the voltage between the bases of the complementary transistors is maintained constant.

BRIEF SUMMARY OF THE INVENTION

In order to overcome the problems of the prior art, a biasing circuit has been developed according to the invention which comprises a transistor having a base, an emitter, and a collector. The emitter of the biasing transistor is connected to a base of one of the pair of complementary transistors in the output stage, while the collector of the biasing transistor is connected to the base of the other of the pair of complementary transistors. Means are provided for biasing the biasing transistor in such a manner that, where desired, the base-to-base voltage for the pair of complementary transistors is maintained constant.

It is an additional feature of the invention to utilize a collector resistor of such size that the base-to-base voltage supplied to the pair of complementary transistors varies with collector current in the biasing transistor in such a manner that the changes in the base-to-emitter voltage in the complementary output transistors are compensated. Thus, the collector resistor of the biasing transistor may be sized to provide a base-to-base voltage which decreases with increasing current in the collector of the biasing stage. In one embodiment, a resistive divider is provided for biasing the base of the biasing transistor while in the second embodiment, the base of the biasing transistor is directly connected to a source of biasing potential.

DETAILED DESCRIPTION OF THE DRAWINGS

Figure 1:
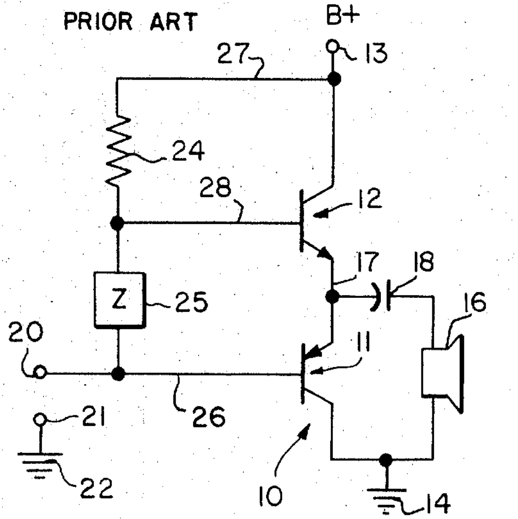
FIG. 1. PRIOR ART
FIG. 1 is a circuit diagram of an amplifier which utilizes a pair of complementary transistors showing generally the biasing element designated as Z.

In FIG. 1, a transistorized power output stage is designated generally at 10 and comprises a first output transistor 11 in series circuit with a second output transistor 12. The transistors 11 and 12 are connected in series between a source of biasing potential 13 and a source of reference potential 14, such as ground. The transistor 11 is a PNP-transistor, while transistor 12 is an NPN-transistor. Both transistors 11 and 12 are biased for Class B operation for driving a low impedance output load 16, such as a loudspeaker. The output signal from the amplifier 10 is taken from the common junction 17 between the emitters of the transistors 11 and 12 through a coupling capacitor 18.

A source of signals to be amplified is provided between the input terminals 20 and 21, the latter being connected directly to a source of reference potential 22, such as ground.

A typical biasing circuit for the amplifier 10 illustrated in FIG. 1 comprises a resistor 24 in series with an impedance element designated generally as Z which is connected between lead 26 in circuit with input terminal 20 and lead 27 connected to the source of biasing potential 13.

In order to bias the amplifier stage 10 properly, the impedance element 25 must forward bias the base-emitter junctions of both transistors 11 and 12. As previously noted, one prior art method of biasing utilizes a battery having its positive terminal connected to lead 28 and its negative terminal connected to lead 26. In this manner, both base-emitter junctions of transistors 11 and 12 are forward-biased. A second circuit element which has been found suitable for use as the impedance element 25 in FIG. 1 is a diode providing a constant voltage equalling the sum of the base-emitter voltages of transistors 11 and 12. However, such an arrangement is not always satisfactory because the diode potential must be matched to the base-to-base potential of the output transistor stage.

Figure 2:
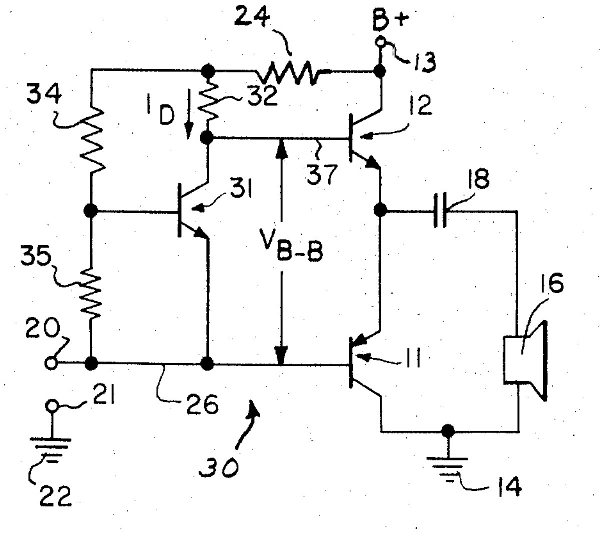
FIG. 2 is a circuit diagram of an amplifier incorporating a pair of complementary transistors and the biasing circuit according to the invention.

According to the invention, and as best seen in FIG. 2, a biasing stage, designated generally at 30, comprises a biasing transistor 31 having its collector connected to a collector resistor 32 which is connected to an output-stage biasing resistor 24. The emitter of the transistor 31 is directly connected to lead 26. The base of transistor 31 is biased by a resistive divider network which comprises resistors 34 and 35, base of the transistor 31 being connected to the common junction therebetween.

The collector of the transistor 31 is also connected to the base of transistor 12 by lead 37, while the emitter of the transistor 31 is connected by lead 26 to the input terminal 20 and to the base of the transistor 11.

It is a first feature of the biasing circuit according to the invention to provide a voltage from the base of transistor 12 to the base of transistor 11 (hereafter the base-to base voltage) which is substantially constant over a wide range of collector currents flowing through the collector resistor 32 into the collector of the transistor 31. When an input signal is applied to terminal 20 and through resistor 35 to the base of the transistor 31, it increases conduction of the transistor 31 for increasing input signals, thus causing an increase in its collector current. However, by sizing resistor 32, as well as resistors 34 and 35 properly, the base-to base voltage at the output of transistor 31 may be kept substantially constant. The base-to emitter voltage of transistor 31 is effectively utilized to provide a constant base-to base voltage for the transistors 11 and 12.

Figure 3:
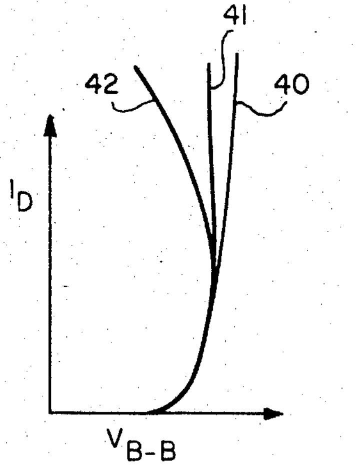
FIG. 3 is a plot of the collector current in the biasing transistor circuit versus the base-to-base voltage supplied by the biasing transistor.

As may be seen in FIG. 3, if resistor 32 has a value of zero representing the direct connection of the collector of transistor 31 to the source of biasing potential 13, the base-to base voltage $V_{B-B}$ applied to the output stage increases slightly with increase in the current flow through resistor 32, which current flow is designated $I_D$. The change in $V_{B-B}$ with $I_D$ when resistor 32 is 0 is shown by curve 40 in FIG. 3.

It is possible to select a value for resistor 32 so that the base-to base voltage is maintained substantially constant with variations in the current $I_D$ as is represented by curve 41 in FIG. 3. When the value of resistor 32 is thus chosen, the output applied to the load 16 is not distorted by changes in the base-to-base voltage applied to the output stage. The maintenance of the base-to-base voltage constant in this manner is effective in preventing distortion provided that the temperature of the transistors remains constant. The base-to-emitter voltages of the transistors tend to decrease with temperature which can cause distortion in the output signal if the base-to-base voltage in the output stage is maintained constant. Since the base-to-emitter voltages of the transistors 11 and 12 decrease with a rise in temperature, and as the temperature increases with increase in conductivity of the transistors, the tendency of the base-to-emitter voltages to change with temperature can be compensated by applying a base-to-base voltage to the output stage which decreases with increasing $I_D$. By making resistor 32 larger, e.g., 4 ohms instead of 1 ohm, the base-to-base voltage $V_{B-B}$ can be made to decrease with increasing $I_D$ as illustrated by curve 42 in FIG. 3. Thus, by selecting the proper value for the resistor 32, distortion in the output signal due to tendency of the base-to-emitter voltage to change with temperature can be compensated.

Figure 4:
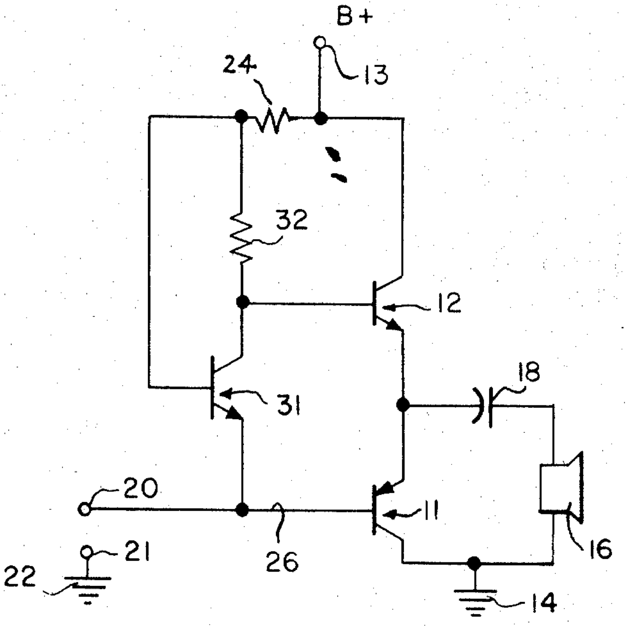
FIG. 4 is an alternative embodiment of the circuit of FIG. 2 wherein the biasing transistor has its base connected directly to the source of biasing potential.

FIG. 4 shows an alternative embodiment for the biasing circuit according to the invention wherein the base of the transistor 31 is directly connected to the junction of resistors 24 and 32. This circuit has the advantage of eliminating the resistive divider network shown in FIG. 2 as comprising resistors 34 and 35 and may be considered the limiting case in which resistor 35 is very much larger than resistor 34. The circuit of FIG. 4 operates in the manner discussed in connection with the operation of the embodiment shown in FIGS. 2 and 3.

Thus, a biasing circuit for a pair of complementary transistors has been described which eliminates distortion of the output signal due to changes in the base-to-base voltage of the complementary transistors with load and changes in the base-to emitter voltage with temperature.

What is claimed is:

1. A bias circuit for an amplifier wherein said bias circuit comprises:

a. connecting means for connecting said bias circuit to a source of biasing potential;

b. a bias transistor having a base, a collector and an emitter, said bias transistor developing a bias voltage for said amplifier between said emitter and collector, and said bias transistor being coupled at its collector and its emitter to said amplifier to apply said bias voltage to said amplifier;

c. means for applying an input signal to said bias transistor at its emitter;

d. feedback means, said feedback means including voltage developing means in circuit with said collector, said voltage developing means being responsive to current flow through said collector to develope a voltage across said voltage developing means; and e. means for applying said developed voltage to the base of said bias transistor for maintaining said bias voltage substantially constant over a predetermined range of collector current flow through said bias transistor.

2. A bias circuit as recited in claim 1 wherein said voltage developing means includes means for causing said bias voltage to decrease with increased ambient temperature over said predetermined range of collector current flow through said bias transistor.

3. A bias circuit as recited in claim 1 wherein said voltage developing means includes means for causing said bias voltage to decrease with an increased collector current over said predetermined range of collector current flow through said bias transistor.

4. A bias circuit as recited in claim 1 wherein said amplifier comprises a pair of complementary PNP and NPN transistors series coupled emitter to emitter, the NPN transistor coupled at its base to the collector of said bias transistor and the PNP transistor coupled at its base to the emitter of said bias transistor.

5. A bias circuit as recited in claim 4 wherein said voltage developing means includes a resistive element preselected to maintain said bias voltage substantially constant over said predetermined range of collector current flow through said bias transistor.

6. A bias circuit as recited in claim 4 wherein said voltage developing means includes a resistive element preselected to cause said bias voltage to decrease as the emitter current of each of said complementary transistors increases with increased ambient temperature over said predetermined range of collector current flow through said bias transistor.

* * * * *